(12) United States Patent
Oh et al.

(10) Patent No.: US 11,640,965 B2
(45) Date of Patent: May 2, 2023

(54) IMAGE SENSOR

(71) Applicant: DB HITEK CO., LTD., Seoul (KR)

(72) Inventors: Dong Jun Oh, Gyeonggi-do (KR); Jong Min Kim, Seoul (KR); Man Lyun Ha, Gyeongsangbuk-do (KR); Jae Hyun Kim, Seoul (KR)

(73) Assignee: DB HITEK CO., LTD., Seoul (KR)

( * ) Notice: Subject to any disclaimer, the term of this patent is extended or adjusted under 35 U.S.C. 154(b) by 290 days.

(21) Appl. No.: 16/949,240

(22) Filed: Oct. 21, 2020

(65) Prior Publication Data
US 2021/0118923 A1 Apr. 22, 2021

(30) Foreign Application Priority Data
Oct. 21, 2019 (KR) ................ 10-2019-0130512

(51) Int. Cl.
 *H04N 25/59* (2023.01)
 *H01L 27/146* (2006.01)
(52) U.S. Cl.
 CPC .. *H01L 27/14603* (2013.01); *H01L 27/14636* (2013.01); *H01L 27/14643* (2013.01); *H04N 25/59* (2023.01)

(58) Field of Classification Search
CPC ............................ H04N 5/356; H04N 25/59
See application file for complete search history.

(56) References Cited

U.S. PATENT DOCUMENTS

2011/0267505 A1\* 11/2011 Dierickx ........... H01L 27/14612
348/E5.079

\* cited by examiner

*Primary Examiner* — Thanh Luu
(74) *Attorney, Agent, or Firm* — Patterson Thuente IP

(57) ABSTRACT

An image sensor includes a substrate having a first conductivity type, a first charge accumulation region disposed in the substrate and having a second conductivity type, a second charge accumulation region connected with the first charge accumulation region, having the second conductivity type and extending downward from an edge of the first charge accumulation region, a pinning region disposed on the first charge accumulation region and having the first conductivity type, a floating diffusion region spaced laterally from the pinning region, a channel region disposed between the pinning region and the floating diffusion region, and a gate structure disposed on the channel region.

10 Claims, 4 Drawing Sheets

IMAGE SENSOR

CROSS-REFERENCE TO RELATED APPLICATION

This application claims the priority benefit of Korean Patent Application No. 10-2019-0130512, filed on Oct. 21, 2019, and all the benefits accruing therefrom under 35 U.S.C. § 119, the contents of which are incorporated by reference in their entirety.

BACKGROUND

The present disclosure relates to an image sensor. More specifically, the present disclosure relates to an image sensor including a photodiode formed in a substrate.

In general, an image sensor is a semiconductor device that converts an optical image into electrical signals, and may be classified or categorized as a Charge Coupled Device (CCD) or a Complementary Metal Oxide Semiconductor (CMOS) Image Sensor (CIS). The CIS includes unit pixels, each including a photodiode and MOS transistors. The CIS sequentially detects the electrical signals of the unit pixels using a switching method, thereby forming an image.

The photodiode may include a charge accumulation region in which charges generated by an incident light are accumulated. For example, the photodiode may include an N-type impurity region in which electrons are accumulated, and a P-type impurity region, which functions as a pinning region for reducing a dark current, may be formed on the N-type impurity region. Further, a second charge accumulation region may be formed under the charge accumulation region. The second charge accumulation region may be used to increase the charge accumulation capacity of the photodiode and expand the dynamic range of the image sensor, and may have a relatively low impurity concentration.

The image sensor may include a floating diffusion region spaced laterally from the charge accumulation region and serving as a charge detection region, a channel region disposed between the charge accumulation region and the floating diffusion region, and a transfer gate structure disposed on the channel region. The electrons accumulated in the charge accumulation region and the second charge accumulation region may be moved into the floating diffusion region through the channel region.

However, when the second charge accumulation region is formed under the charge accumulation region as described above, the charge accumulation region and the second charge accumulation region may not be sufficiently depleted. In particular, central portions of the charge accumulation region and the second charge accumulation region may not be depleted, and thus the electrons may be accumulated in the central portions of the charge accumulation region and the second charge accumulation region. In this case, because the distance from the central portions of the charge accumulation region and the second charge accumulation region to the floating diffusion region is relatively long, some of the electrons may not move to the floating diffusion region and may remain in the central portions of the charge accumulation region and the second charge accumulation region. The remaining electrons as described above may cause an image lag problem and may deteriorate the operation characteristics of the image sensor.

SUMMARY

The present disclosure provides an image sensor capable of expanding the dynamic range and reducing the image lag.

In accordance with an aspect of the present disclosure, an image sensor may include a substrate having a first conductivity type, a first charge accumulation region disposed in the substrate and having a second conductivity type, a second charge accumulation region connected with the first charge accumulation region, having the second conductivity type and extending downward from an edge of the first charge accumulation region, a pinning region disposed on the first charge accumulation region and having the first conductivity type, a floating diffusion region spaced laterally from the pinning region, a channel region disposed between the pinning region and the floating diffusion region, and a gate structure disposed on the channel region.

In accordance with some embodiments of the present disclosure, the second charge accumulation region may have a tube shape.

In accordance with some embodiments of the present disclosure, the second charge accumulation region may include a first region adjacent to the gate structure and a second region spaced apart from the gate structure.

In accordance with some embodiments of the present disclosure, the first region may have an impurity concentration higher than that of the second region.

In accordance with some embodiments of the present disclosure, the first region may have a width wider than that of the second region.

In accordance with some embodiments of the present disclosure, the first region may have a depth deeper than that of the second region.

In accordance with some embodiments of the present disclosure, the image sensor may further include a well region disposed in the second charge accumulation region and having the first conductivity type.

In accordance with some embodiments of the present disclosure, the image sensor may further include a well region configured to surround outer side surfaces of the second charge accumulation region and having the first conductivity type.

In accordance with some embodiments of the present disclosure, the image sensor may further include a device isolation region disposed on the well region, and a second pinning region disposed between the well region and the device isolation region and having the first conductivity type. In this case, the well region and the pinning region may be electrically connected with each other by the second pinning region.

In accordance with some embodiments of the present disclosure, the image sensor may further include a well region disposed in the substrate and having the first conductivity type. In this case, the second charge accumulation region may be disposed in the well region.

In accordance with some embodiments of the present disclosure, the image sensor may further include a device isolation region disposed on the well region, and a second pinning region disposed between the well region and the device isolation region and having the first conductivity type. In this case, the well region and the pinning region may be electrically connected with each other by the second pinning region.

In accordance with some embodiments of the present disclosure, the first charge accumulation region may have an impurity concentration higher than that of the second charge accumulation region.

In accordance with an aspect of the present disclosure, an image sensor may include a substrate having a first conductivity type, a first charge accumulation region disposed in the substrate and having a second conductivity type, a pinning region disposed on the first charge accumulation region and having the first conductivity type, a floating diffusion region spaced laterally from the pinning region, a channel region disposed between the pinning region and the floating diffusion region, a gate structure disposed on the channel region, and a second charge accumulation region connected with the first charge accumulation region, having the second conductivity type and extending downward from an edge portion of the first charge accumulation region adjacent to the gate structure.

In accordance with the embodiments of the present disclosure as described above, because the second charge accumulation region has the tube shape, the first and second charge accumulation regions may be fully depleted, and the charge accumulation capacity of the first and second charge accumulation regions may be significantly increased. As a result, the number of electrons accumulated in the first and second charge accumulation regions may be greatly increased, and thus, the dynamic range of the image sensor may be greatly expanded. Further, electrons generated by an incident light may be accumulated in the edge portions of the first and second charge accumulation regions by an internal potential of the first and second charge accumulation regions, and the distance between the electrons and the channel region may thus be reduced. As a result, the number of electrons moving from the first and second charge accumulation regions to the floating diffusion region may be increased. Still further, the number of electrons remaining in the first and second charge accumulation regions may be reduced, and the image lag of the image sensor may thus be reduced.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Embodiments can be understood in more detail from the following description taken in conjunction with the accompanying drawings, in which.

Figure 1:
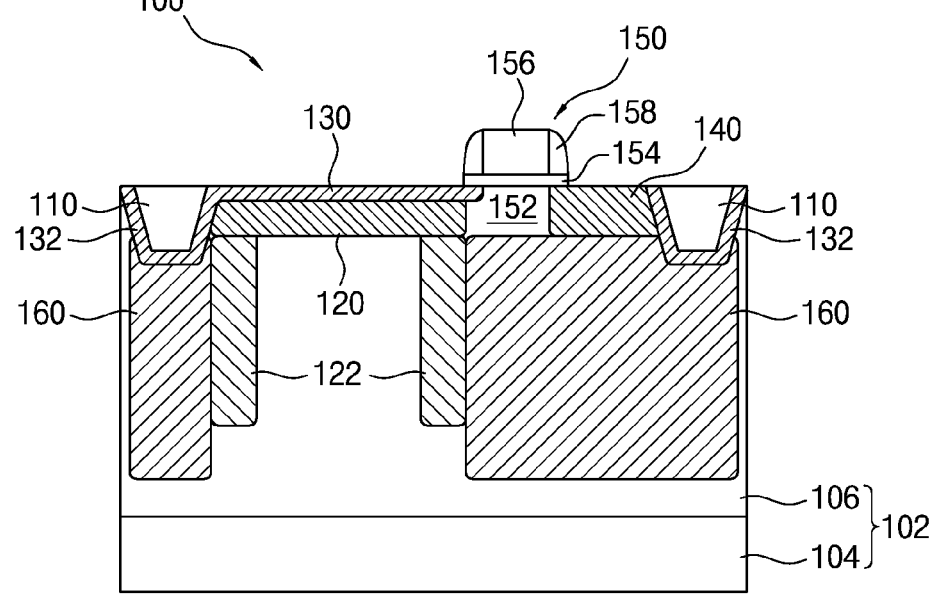
FIG. 1 is a cross-sectional view illustrating an image sensor in accordance with an embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of idealized embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

FIG. 1 is a cross-sectional view illustrating an image sensor in accordance with an embodiment of the present disclosure.

Referring to FIG. 1, an image sensor 100, in accordance with an embodiment of the present disclosure, may include a plurality of pixel regions formed in a substrate 102, and each of the pixel regions may include a pinned photodiode and a charge detection region. For example, the image sensor 100 may include a device isolation region 110 for electrically isolating the pixel regions with one another.

The pinned photodiode and the charge detection region may be formed in an active region defined by the device isolation region 110. For example, the image sensor 100 may include a first charge accumulation region 120 formed in the substrate 102 and a pinning region 130 formed on the first charge accumulation region 120.

The substrate 102 may have a first conductivity type. For example, the substrate 102 may include a P-type bulk silicon substrate 104 and a P-type epitaxial layer 106 formed on the P-type bulk silicon substrate 104. In such case, the first charge accumulation region 120 may be formed in the P-type epitaxial layer 106, and the pinning region 130 may be formed in a surface portion of the P-type epitaxial layer 106.

In accordance with an embodiment of the present disclosure, a second charge accumulation region 122 may be formed in the P-type epitaxial layer 106. The second charge accumulation region 122 may be used to increase the charge accumulation capacity of the pinned photodiode and to expand the dynamic range of the image sensor 100, and may have an impurity concentration lower than that of the first charge accumulation region 120. For example, the second charge accumulation region 122 may extend downward from an edge of the first charge accumulation region 120. The first and second charge accumulation regions 120 and 122 may have a second conductivity type. For example, the first and second charge accumulation regions 120 and 122 may be N-type impurity regions and may be formed by an ion implantation process. The pinning region 130 may be an impurity region having the first conductivity type, for example, a P-type impurity region and may be formed by an ion implantation process. The first and second charge accumulation regions 120 and 122 and the pinning region 130 may function as the pinned photodiode.

In accordance with an embodiment of the present disclosure, the second charge accumulation region 122 may have a tube shape. For example, the first charge accumulation region 120 may have an approximately rectangular plate shape, and the second charge accumulation region 122 may have an approximately rectangular tube shape connected to an edge of a lower surface of the first charge accumulation region 120.

As the second charge accumulation region 122 has the tube shape as described above, the PN junction area between the first and second charge accumulation regions 120 and 122 and the P-type epitaxial layer 106 may be increased, and thus the charge accumulation capacity of the pinned photodiode may be increased compared to conventional systems. Further, the first and second charge accumulation regions 120 and 122 may be fully depleted. Particularly, the first charge accumulation region 120 may have an impurity concentration higher than that of the second charge accumulation region 122, and electrons generated by the incident light may be accumulated in edge portions of the first and second charge accumulation regions 120 and 122 by an internal potential of the first and second charge accumulation regions 120 and 122.

The image sensor 100 may include a floating diffusion region 140 spaced laterally from the pinning region 130 and serving as the charge detection region, a channel region 152 disposed between the pinning region 130 and the floating diffusion region 140, and a gate structure 150 disposed on the channel region 152. The gate structure 150 may include a gate insulating layer 154 disposed on the channel region 152, a gate electrode 156 disposed on the gate insulating layer 154, and gate spacers 158 disposed on side surfaces of the gate electrode 156.

The floating diffusion region 140 may have the second conductivity type. For example, the floating diffusion region 140 may be an N-type impurity region and may be formed by an ion implantation process. A surface portion of the P-type epitaxial layer 106 disposed between the pinning region 130 and the floating diffusion region 140 may be used as the channel region 152, and a silicon oxide layer formed by a thermal oxidation process may be used as the gate insulating layer 154.

In accordance with an embodiment of the present disclosure, the image sensor 100 may include a first well region 160 surrounding outer side surfaces of the second charge accumulation region 122 and having the first conductivity type. For example, the first well region 160 may be a P-type impurity region formed by an ion implantation process. The first well region 160 may be used to fully deplete the second charge accumulation region 122.

The device isolation region 110 may be formed on the first well region 160, and a second pinning region 132 may be formed between the device isolation region 110 and the first well region 160. For example, the device isolation region 110 may be made of silicon oxide or silicon nitride and may be formed by a STI (Shallow Trench Isolation) process. The second pinning region 132 may have the first conductivity type. For example, the second pinning region 132 may be a P-type impurity region and may be simultaneously formed with the pinning region 130 by an ion implantation process.

The pinning region 130 and the first well region 160 may be electrically connected by the second pinning region 132. For example, after forming the first well region 160 in the P-type epitaxial layer 106, trenches (not shown) for the device isolation region 110 may be formed by an etching process, and the pinning region 130 and the second pinning region 132 may then be formed to be electrically connected with the first well region 160 by an ion implantation process. Particularly, the first well region 160 may be formed deeper than the second charge accumulation region 122 for electrical isolation from an adjacent pixel region.

In accordance with the embodiment of the present disclosure as described above, because the second charge accumulation region 122 has the tube shape, the first and second charge accumulation regions 120 and 122 may be fully depleted, and the charge accumulation capacity of the pinned photodiode may be significantly increased compared to conventionally used geometries. As a result, the number of electrons accumulated in the first and second charge accumulation regions 120 and 122 may be greatly increased, and thus, the dynamic range of the image sensor 100 may be greatly expanded.

Particularly, the electrons may be accumulated in the edge portions of the first and second charge accumulation regions 120 and 122 by the internal potential of the first and second charge accumulation regions 120 and 122, and the distance between the electrons and the channel region 152 may thus be reduced. As a result, the number of electrons moving from the first and second charge accumulation regions 120 and 122 to the floating diffusion region 140 may be increased. Further, the number of electrons remaining in the first and second charge accumulation regions 120 and 122 may be reduced, and thus the image lag of the image sensor 100 may be significantly reduced.

Figure 2:
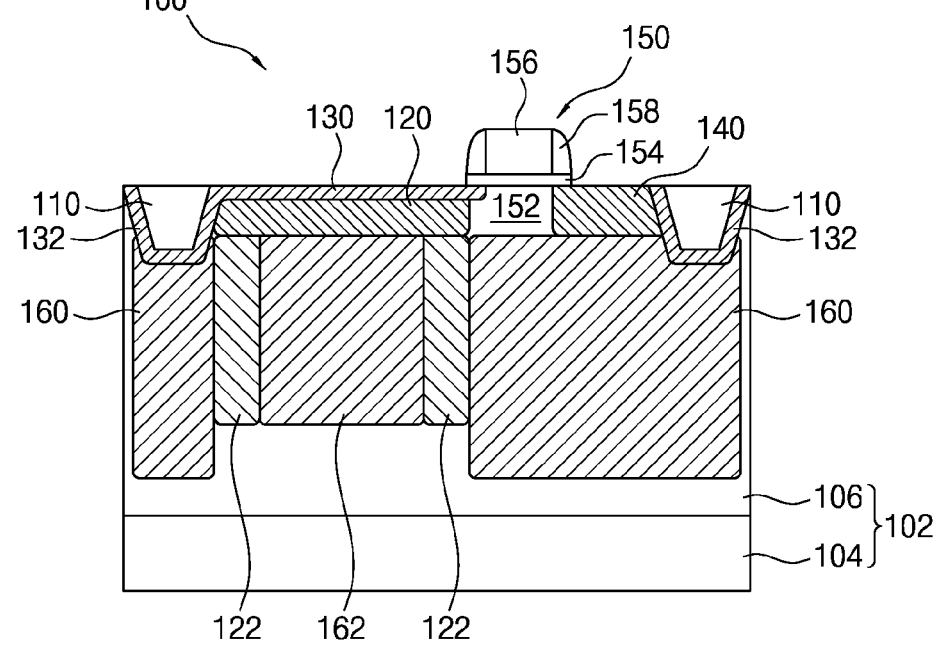
FIG. 2 is a cross-sectional view illustrating an image sensor in accordance with another embodiment of the present disclosure.

FIG. 2 is a cross-sectional view illustrating an image sensor in accordance with another embodiment of the present disclosure.

Referring to FIG. 2, an image sensor 100 may include a substrate 102 having a first conductivity type, a first charge accumulation region 120 disposed in the substrate and having a second conductivity type, a second charge accumulation region 122 connected with the first charge accumulation region 120, having the second conductivity type and extending downward from an edge of the first charge accumulation region 120, a pinning region 130 disposed on the first charge accumulation region 120 and having the first conductivity type, a floating diffusion region 140 spaced laterally from the pinning region 130, a channel region 152 disposed between the pinning region 130 and the floating diffusion region 140, and a gate structure 150 disposed on the channel region 152. Like reference numbers are used in FIG. 2 to refer to the features of FIG. 1 that have been described above, and the description thereof is not repeated herein.

The second charge accumulation region 122 may have a tube shape, and the image sensor 100 may include a first well region 160 surrounding the outer side surfaces of the second charge accumulation region 122, and a second well region 162 disposed in the second charge accumulation region 122. The first and second well regions 160 and 162 may have the first conductivity type, and may be used to fully deplete the first and second charge accumulation regions 120 and 122.

Figure 3:
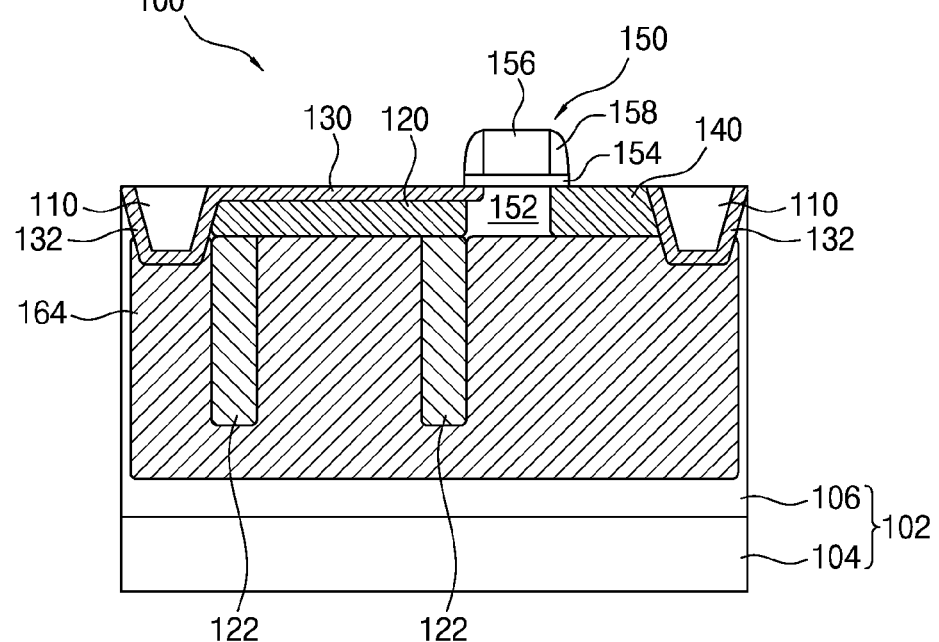
FIG. 3 is a cross-sectional view illustrating an image sensor in accordance with still another embodiment of the present disclosure.

FIG. 3 is a cross-sectional view illustrating an image sensor in accordance with still another embodiment of the present disclosure. As with FIG. 2, like reference numbers are used in FIG. 3 to refer to the features of FIGS. 1 and 2 that have been described above, and the description thereof is not repeated herein Referring to FIG. 3, an image sensor 100 may include a substrate 102 having a first conductivity type, a first charge accumulation region 120 disposed in the substrate and having a second conductivity type, a second charge accumulation region 122 connected with the first charge accumulation region 120, having the second conductivity type and extending downward from an edge of the first charge accumulation region 120, a pinning region 130 disposed on the first charge accumulation region 120 and having the first conductivity type, a floating diffusion region 140 spaced laterally from the pinning region 130, a channel region 152 disposed between the pinning region 130 and the floating diffusion region 140, and a gate structure 150 disposed on the channel region 152.

Particularly, the image sensor 100 may include a well region 164 formed in the substrate 102 and having the first conductivity type, and the second charge accumulation region 122 may have a tube shape and may be formed in the well region 164. The well region 164 may be used to fully deplete the first and second charge accumulation regions 120 and 122. Further, a device isolation region 110 may be formed on the well region 164, and a second pinning region 132 having the first conductivity type may be formed between the well region 164 and the device isolation region 110. At this time, the well region 164 and the pinning region 130 may be electrically connected with each other by the second pinning region 132.

Figure 4:
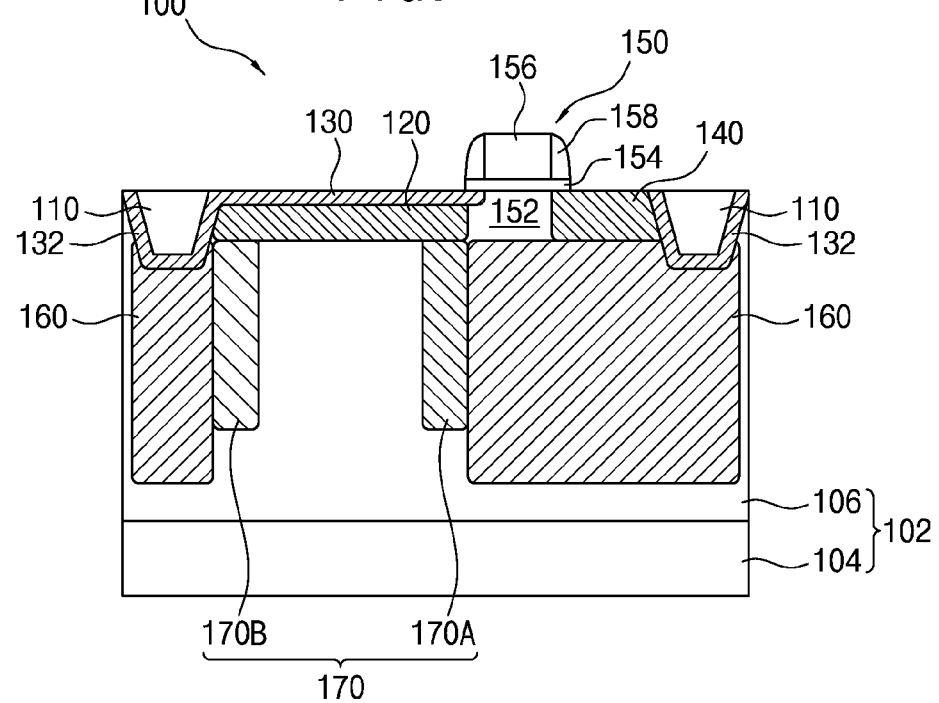
FIGS. 4 to 6 are cross-sectional views illustrating an image sensor in accordance with still another embodiment of the present disclosure.
Figure 5:
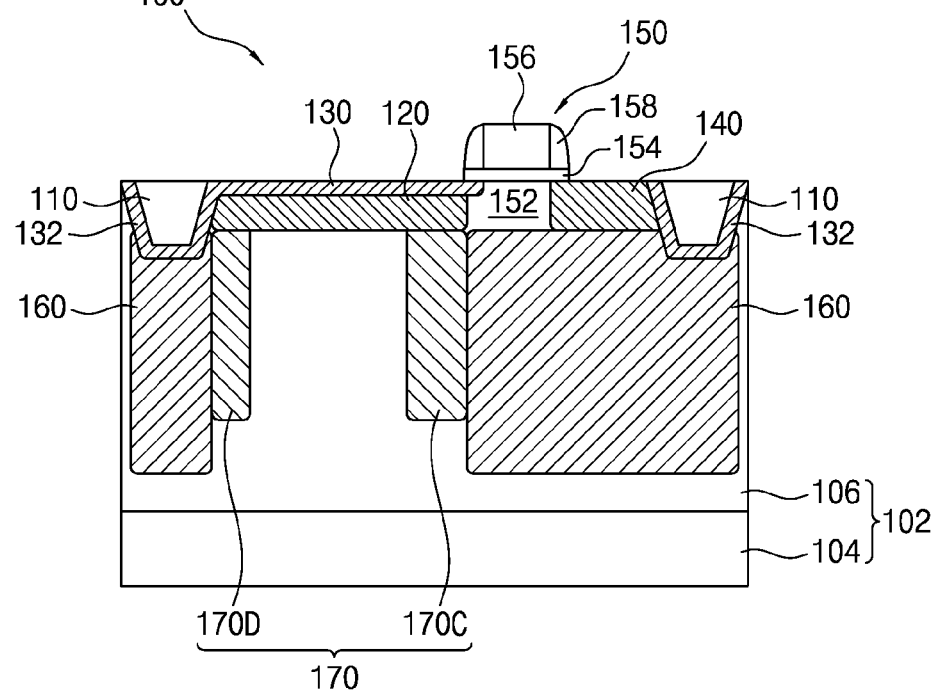
Figure 6:
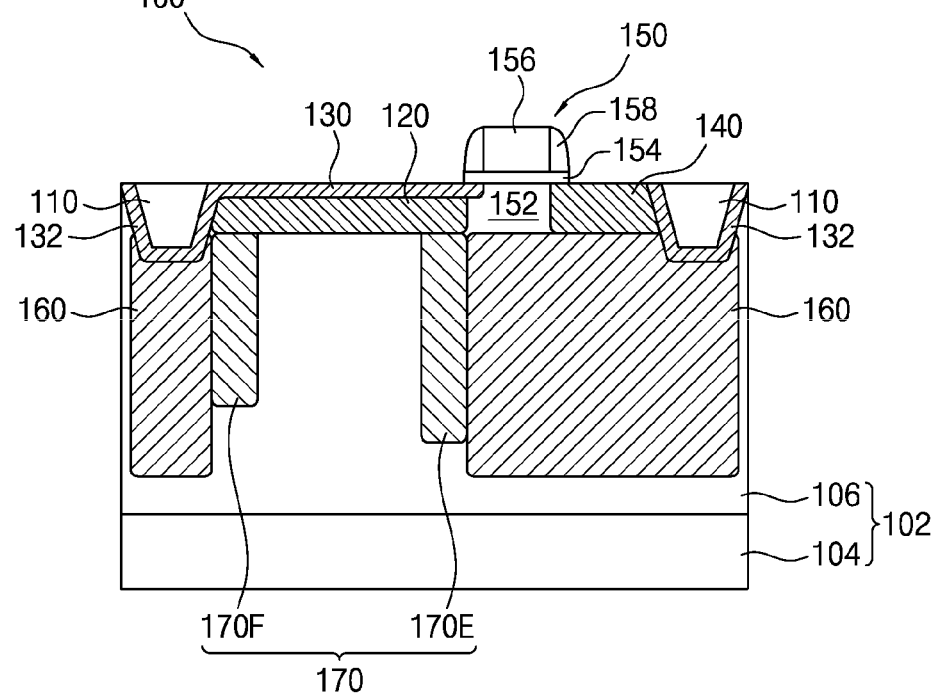

FIGS. 4 to 6 are cross-sectional views illustrating an image sensor in accordance with still another embodiment of the present disclosure. As with FIGS. 2 and 3, like reference numbers are used in FIGS. 4 to 6 to refer to the features of FIG. 1-3 that have been described above, and the description thereof is not repeated herein Referring to FIG. 4, an image sensor 100 may include a substrate 102 having a first conductivity type, a first charge accumulation region 120 disposed in the substrate and having a second conductivity type, a second charge accumulation region 170 connected with the first charge accumulation region 120, having the second conductivity type and extending downward from an edge of the first charge accumulation region 120, a pinning region 130 disposed on the first charge accumulation region 120 and having the first conductivity type, a floating diffusion region 140 spaced laterally from the pinning region 130, a channel region 152 disposed between the pinning region 130 and the floating diffusion region 140, and a gate structure 150 disposed on the channel region 152.

Particularly, the second charge accumulation region 170 may have a tube shape, and may include a first region 170A adjacent to the gate structure 150 and a second region 170B spaced apart from the gate structure 150. At this time, the first region 170A may have an impurity concentration higher than that of the second region 170B, and electrons generated by an incident light may be accumulated in edge portions of the first and second charge accumulation regions 120 and 170 by an internal potential of the first and second charge accumulation regions 120 and 170.

As another example, as shown in FIG. 5, the second charge accumulation region 170 may have a tube shape, and may include a first region 170C adjacent to the gate structure 150 and a second region 170D spaced apart from the gate structure 150. At this time, the first region 170C may have a width wider than that of the second region 170D.

As still another example, as shown in FIG. 6, the second charge accumulation region 170 may have a tube shape, and may include a first region 170E adjacent to the gate structure 150 and a second region 170F spaced apart from the gate structure 150. At this time, the first region 170E may have a depth deeper than that of the second region 170F.

Figure 7:
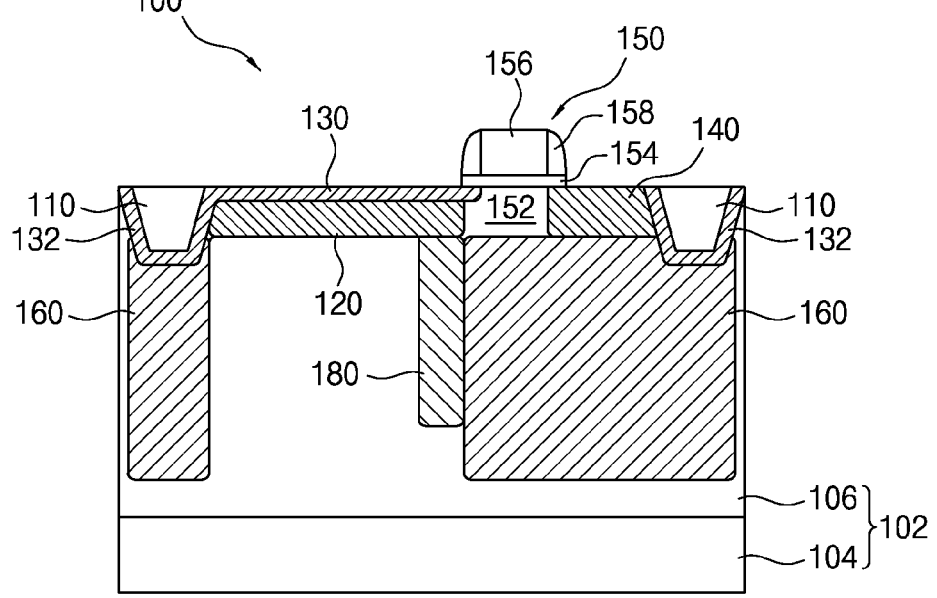
FIG. 7 is a cross-sectional view illustrating an image sensor in accordance with still another embodiment of the present disclosure.

FIG. 7 is a cross-sectional view illustrating an image sensor in accordance with still another embodiment of the present disclosure. As with FIGS. 2-6, like reference numbers are used in FIG. 7 to refer to the features of FIG. 1-6 that have been described above, and the description thereof is not repeated herein Referring to FIG. 7, an image sensor 100 may include a substrate 102 having a first conductivity type, a first charge accumulation region 120 disposed in the substrate and having a second conductivity type, a pinning region 130 disposed on the first charge accumulation region 120 and having the first conductivity type, a floating diffusion region 140 spaced laterally from the pinning region 130, a channel region 152 disposed between the pinning region 130 and the floating diffusion region 140, and a gate structure 150 disposed on the channel region 152.

Particularly, the image sensor 100 may include a second charge accumulation region 180 connected with the first charge accumulation region 120, having the second conductivity type and extending downward from an edge portion of the first charge accumulation region 120 adjacent to the gate structure 150. For example, the second charge accumulation region 180 may have a bar or plate shape extending downward from the edge portion of the first charge accumulation region 120. Alternatively, the second charge accumulation region 180 may have an alphabetic "L"-shaped cross section or a channel shape and may extend downward from the edge portion of the first charge accumulation region 120.

Although the image sensor has been described with reference to specific embodiments, it is not limited thereto. Therefore, it will be readily understood by those skilled in the art that various modifications and changes can be made thereto without departing from the spirit and scope of the present disclosure defined by the appended claims.

The invention claimed is:

1. An image sensor comprising:
a substrate having a first conductivity type;
a first charge accumulation region disposed in the substrate and having a second conductivity type;
a second charge accumulation region connected with the first charge accumulation region, the second charge accumulation region having the second conductivity type, extending from an edge of the first charge accumulation region into the substrate, and defining a tube shape;
a pinning region disposed on the first charge accumulation region and having the first conductivity type;
a floating diffusion region spaced laterally from the pinning region;
a channel region disposed between the pinning region and the floating diffusion region;

a gate structure disposed on the channel region; and
a well region disposed in the second charge accumulation region and having the first conductivity type.

2. The image sensor of claim 1, wherein the second charge accumulation region comprises a first region adjacent to the gate structure and a second region spaced apart from the gate structure.

3. The image sensor of claim 2, wherein the first region has an impurity concentration higher than that of the second region.

4. The image sensor of claim 2, wherein the first region has a width wider than that of the second region.

5. The image sensor of claim 2, wherein the first region extends into the substrate for a depth greater than that of the second region.

6. An image sensor comprising:
a substrate having a first conductivity type;
a first charge accumulation region disposed in the substrate and having a second conductivity type;
a second charge accumulation region connected with the first charge accumulation region, the second charge accumulation region having the second conductivity type and extending from an edge of the first charge accumulation region into the substrate;
a pinning region disposed on the first charge accumulation region and having the first conductivity type;
a floating diffusion region spaced laterally from the pinning region;
a channel region disposed between the pinning region and the floating diffusion region;
a gate structure disposed on the channel region; and
a well region configured to surround outer side surfaces of the second charge accumulation region and having the first conductivity type.

7. The image sensor of claim 6, further comprising:
a device isolation region disposed on the well region; and
a second pinning region disposed between the well region and the device isolation region and having the first conductivity type,
wherein the well region and the pinning region are electrically connected with each other by the second pinning region.

8. An image sensor comprising:
a substrate having a first conductivity type;
a first charge accumulation region disposed in the substrate and having a second conductivity type;
a second charge accumulation region connected with the first charge accumulation region, the second charge accumulation region having the second conductivity type and extending from an edge of the first charge accumulation region into the substrate;
a pinning region disposed on the first charge accumulation region and having the first conductivity type;
a floating diffusion region spaced laterally from the pinning region;
a channel region disposed between the pinning region and the floating diffusion region;
a gate structure disposed on the channel region; and
a well region disposed in the substrate and having the first conductivity type,
wherein the second charge accumulation region is disposed in the well region.

9. The image sensor of claim 8, further comprising:
a device isolation region disposed on the well region; and
a second pinning region disposed between the well region and the device isolation region and having the first conductivity type,
wherein the well region and the pinning region are electrically connected with each other by the second pinning region.

10. The image sensor of claim 8, wherein the first charge accumulation region has an impurity concentration higher than that of the second charge accumulation region.

* * * * *